United States Patent [19]

Hayakawa et al.

[11] Patent Number: 4,796,239
[45] Date of Patent: Jan. 3, 1989

[54] CIRCUIT UNIT FOR TIMEPIECE AND PROCESS FOR FABRICATING THE SAME

[75] Inventors: Tsuyoshi Hayakawa; Satoru Yamauchi; Isato Watanabe; Isao Kondo, all of Tokyo, Japan

[73] Assignee: Seikosha Co., Ltd., Tokyo, Japan

[21] Appl. No.: 37,466

[22] Filed: Apr. 13, 1987

[30] Foreign Application Priority Data

May 8, 1986 [JP] Japan .................................. 61-105492
May 23, 1986 [JP] Japan .................................. 61-118470

[51] Int. Cl.⁴ ..................... G04C 23/02; H02G 13/08
[52] U.S. Cl. ..................................... 368/88; 174/52.2; 29/827
[58] Field of Search ..................... 368/85–87, 368/88, 155, 156, 3 K; 174/52 R, 52 PE, 68.5; 29/626, 627, 625, 827, 832, 845, 846, 855

[56] References Cited

U.S. PATENT DOCUMENTS

| | | | |
|---|---|---|---|
| 3,611,061 | 10/1971 | Segerson | 174/52 PE |
| 3,885,304 | 5/1975 | Kaiser et al. | 174/52 PE |
| 3,908,075 | 9/1975 | Jackson et al. | 174/52 PE |
| 4,086,696 | 5/1978 | Ikuta | 174/52 PE |
| 4,164,843 | 8/1979 | Fujimori | 368/88 |
| 4,186,551 | 2/1980 | Nakayama | 368/88 |
| 4,241,436 | 12/1980 | Bolzt et al. | 368/88 |
| 4,546,697 | 1/1981 | Smith | 29/827 |

*Primary Examiner*—Vit W. Miska
*Attorney, Agent, or Firm*—Bruce L. Adams; Van C. Wilks

[57] ABSTRACT

A circuit unit including a plurality of lead frames which are made of a metal sheet and one of which is used for die-bonding an integrated circuit. The die-bonding lead member is formed to have at least a generally H-shaped portion constructed of a pair of parallel side portions and a connecting portion for connecting the two side portions for die-bonding the integrated circuit thereto. The remaining lead members are separated from said die-bonding one and have individual end portions positioned in the vicinity of the integrated circuit and connected electrically therewith by means of bonding wires. The die-bonding lead member and the remaining lead members are integrated either with a potting resin for protection the integrated circuit or with the potting resin and/or an insulating plate backing the potting resin. The aforementioned two side portions are fixed on a holding member. Also disclosed is a process for fabricating the aforementioned circuit unit.

10 Claims, 2 Drawing Sheets

CIRCUIT UNIT FOR TIMEPIECE AND PROCESS FOR FABRICATING THE SAME

BACKGROUND OF THE INVENTION

1. Field of the Invention

The present invention relates to a circuit unit for a timepiece and a process for fabricating the circuit unit.

2. Description of the Prior Art

A representative technique of the prior art of the above-specified field is disclosed in Japanese patent publication No. 27952/60(1985) entitled "Drive Circuit Unit for Timepiece" and commonly assigned to the present Applicant. In that circuit unit, there is sandwiched between two sheets of insulating frames a lead frame having a predetermined pattern, in which a circuit element such as an integrated circuit is mounted.

Since the two sheets of frames are required for sandwiching the lead frame, the prior art is accompanied by a problem that the numbers of parts and fabricating steps are increased in the assembly process. Moreover, that circuit unit is difficult to handle so that its mounting in a timepiece prevents automatic assembly in case it is assembled with the timepiece. Additionally, the circuit unit has to be coupled to the contact members of a battery or motor so that the number of its working steps is increased thereby raising the production cost.

SUMMARY OF THE INVENTION

It is, therefore, an object of the present invention to provide a circuit unit for a timepiece, which can be fabricated without difficulty at a reasonable cost by reducing the number of its parts.

In order to achieve this object, according to the present invention, there is provided a circuit unit including a plurality of lead frames which are made of a metal sheet and one of which is used for die-bonding an integrated circuit. This die-bonding lead member is formed so as to have at least a generally H-shaped portion constructed of a pair of parallel side portions and a connecting portion for connecting the two side portions for die-bonding the integrated circuit thereto. The remaining lead members are separated from die-bonded lead member and have individual end portions positioned in the vicinity of the integrated circuit and are connected electrically therewith by means of bonding wires. The die-bonded lead member and the remaining lead members are integrated either with a potting resin for protecting the integrated circuit or with both potting resin and an insulating plate backing the potting resin. The aforementioned two side portions are fixed on a holding member.

According to another feature of the circuit unit fabricating process of the present invention, an integrated circuit is connected with a lead frame which includes a plurality of lead members connected integrally through bridges. The individual lead members are held integrally through a potting resin by covering the integrated circuit with the potting resin. After this step, the bridges are cut off to separate the lead frames.

BRIEF DESCRIPTION OF THE DRAWINGS

Other objects, features and advantages of the present invention will become apparent from the following description taken in conjunction with the accompanying drawings, in which.

DESCRIPTION OF THE PREFERRED EMBODIMENTS

The present invention will be be described in the following description taken in connection with the embodiments thereof with reference to the accompanying drawings.

Figure 1:
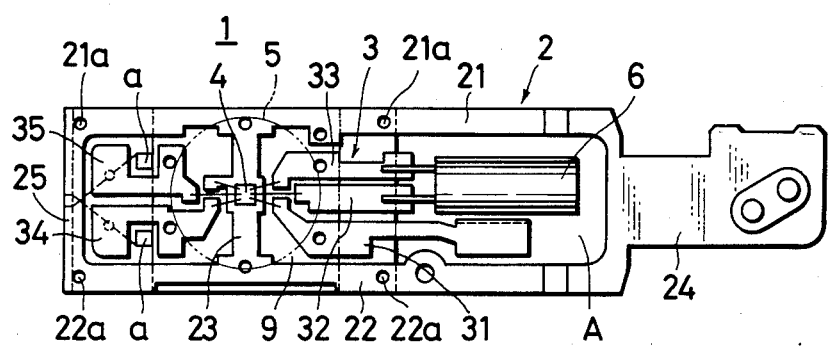
FIG. 1 is a top plan view showing a circuit unit according to one embodiment of the present invention.

In FIG. 1, a lead frame 1 is made of a metal sheet and constructed of a lead member 2 for die-bonding an integrated circuit and other lead members 3. The former lead member 2 is shaped generally into a letter "H" and composed of a pair of parallel side portions 21 and 22 and a connecting portion 23 connecting the side portions 21 and 22. An integrated circuit 4 is die-bonded to that connecting portion 23. The lead members 3 (comprised of individual members 31, 32, 33, 34 and 35) other than the die-bonding lead member 2 are arranged separately of the lead member 2 to have their individual one end portions positioned in the vicinity of the integrated circuit 4. These one end portions of the lead members 3 are electrically connected with the integrated circuit 4 through bonding wires. Incidentally, this connecting method should not be limited to the wire bonding method but can be achieved by a face-down bonding method such as the flip chip or beam lead method.

The die-bonding lead member 2 and the one end portions of the remaining lead members 3 are mechanically integrated with a potting resin 5 for protecting the integrated circuit 4. This integration can be effected with the potting resin 5 only but is conducted in the present embodiment together with an insulating sheet 9 backing the potting resin 5. On the other hand, the generally H-shaped die-bonding lead member 2 forms jointing members 24 and 25 connecting the respective end portions of the aforementioned two side portions 21 and 22. The remaining lead members 31 to 35 are arranged in a compartment A which is enclosed by the those two side members 21 and 22, the connecting portion 23 and jointing members 24 and 25. Those lead members 31 to 35 have other individual end portions which are exposed from the potting resin 5 and free of support by the insulating sheet or plate 9 and to which are directly connected a quartz oscillator 6 or capacitors and resistors, which are required for constructing the watch driving circuit.

On the other hand, one 24 of the two jointing members (24) and 25 need not be jointed to one contact of a battery because it has already been jointed, as is different from the prior art.

Figure 2:
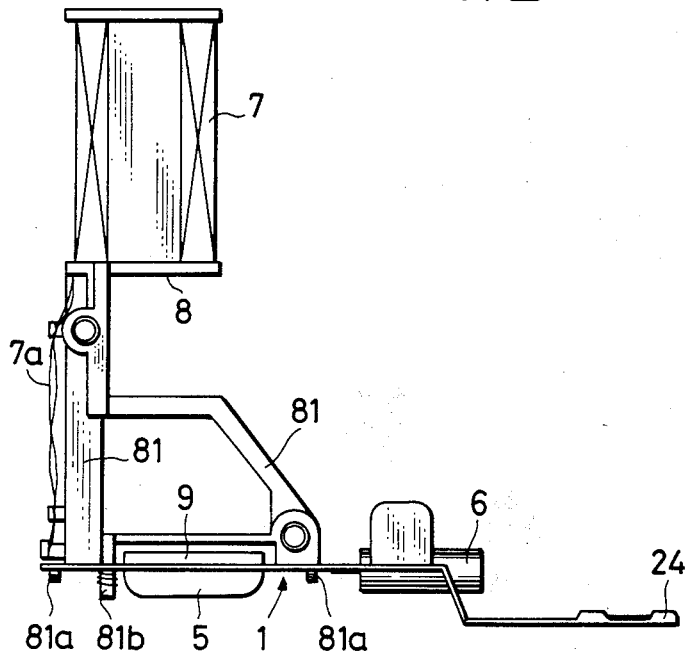
FIG. 2 is a front elevation showing the mounted state of the circuit of FIG. 1.

The lead frame 1, which is mechanically integrated either with the potting resin 5 only or with this potting resin and the backing insulating sheet 9, is held by fixing the two side portions 21 and 22 to a holding member. In the present embodiment, this holding member is a coil bobbin 8 (as shown in FIG. 2), which is fitted on one stator member of the (not-shown) stator of a driving motor and on which a driver coil 7 is wound. This coil bobbin 8 is integrally formed with support members 81 and 81 which in turn are formed with projections 81a and 81b, respectively. These projections 81a and 81a are inserted into connecting holes 21a and 22a, which are formed in advance in the side portions 21 and 22 of the lead member 2, and are thermally welded. Additionally, the support members 81 are formed with projections 81b for anchoring the lead wires 7a of the coil 7. These projections 81b are arranged at points a and a in the compartment A of the lead frame 1. The lead wires 7a anchored at the projections 81b are extended across the lead members 34 and 35 such that they are electrically connected with the lead members 34 and 35. This makes it remarkably easy to provide the electric connection between the motor coil 7 and the electric circuit.

Figure 3:
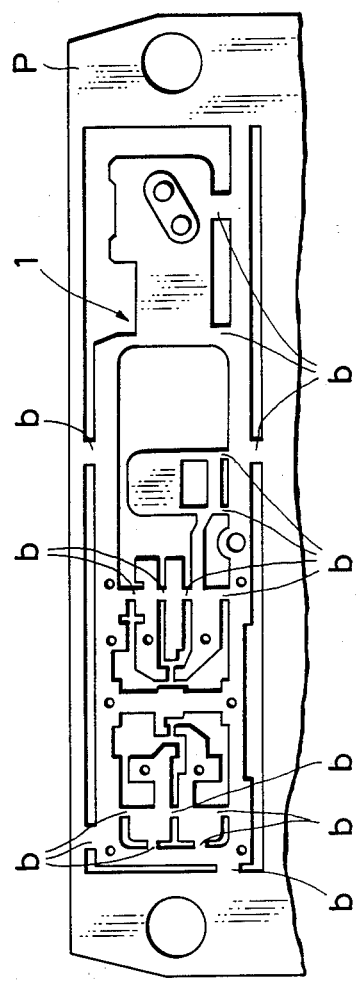
FIG. 3 is a front elevation showing a lead frame immediately after it has been pressed out of an original sheet.

The lead frame 1 is formed by pressing an original sheet P of a metal such as stainless steel. At this stage, the individual lead members are connected integrally through bridges b, as shown in FIG. 3. The cutting steps of the bridges b are conducted such that they are mechanically held either with the potting resin 5 or with this potting resin and the insulating sheet 9 (as shown in FIGS. 1 and 2), as has been described above.

After this, electric parts such as the quartz oscillator 6 of FIGS. 1 and 2 and the not-shown capacitors are connected.

As has been described hereinbefore, the individual lead members constructing the lead frame are integrally held with the potting resin covering the integrated circuit. As a result, no special holding part is required thereby reducing the number of parts so that the circuit unit can be fabricated compactly with remarkable ease. Since, moreover, this circuit unit is integrated with the battery contacts, the workability of the automatic assembly can be integrated to facilitate incorporation of the circuit element. This circuit unit is fixed through the side portions of the lead member so they can enjoy a sufficient mounting strength.

What is claimed is:

1. In a circuit unit for a timepiece comprising a plurality of lead members constructed of individual metal sheets, the improvement comprising: a lead frame to which an integrated circuit is die-bonded, said lead frame comprising a die-bonding lead member formed into a letter "H" and including a pair of parallel side portions and a connecting portion connecting said side portions and having said integrated circuit die-bonded to said connecting portion;

other lead members comprising part of said lead frame and separated from said die-bonding lead member and arranged such that individual one end portions of said other lead members are positioned in the vicinity of said integrated circuit and electrically connected with said integrated circuit;

both said die-bonding lead member and said individual one end portions of said other lead members being integrated with a potting resin for protecting said integrated circuit and/or an insulating plate backing said potting resin such that individual other end portions of said other lead members are exposed from the potting resin and are free of support by the insulating plate to define electrical contacts with external circuit elements; and both said parallel side portions being fixed on a holding member.

2. The circuit unit according to claim 1, wherein said generally H-shaped die bonding lead member further includes jointing members for connecting respective end portions of said two side portions, the other lead members being arranged in a compartment which is surrounded by said two side portions, said connecting portion and said jointing members.

3. The circuit unit according to claim 2, wherein one of said jointing members is connected with a contact of a battery.

4. A circuit unit according to claim 1, wherein said holding member is formed integrally with a coil bobbin on which a driver coil of a driving motor is wound.

5. A process for fabricating a circuit unit for a watch, comprising the steps of:

connecting an integrated circuit with a lead frame having a plurality of lead members having individual one end portions disposed adjacent to the integrated circuit and individual other end portions connected integrally through bridges;

holding said one end portions of the lead members integrally through a potting resin by covering said integrated circuit with said potting resin such that the other end portions of the lead members are exposed from the potting resin; and cutting said bridges to separate the other end portions of said lead members such that the other end portions of the lead members are made free of any support.

6. The circuit unit according to claim 1, wherein the individual one end portions of the other lead members are electrically connected with said integrated circuit by bonding wires connected to the one end portions of the other lead members that are positioned in the vicinity of said integrated circuit.

7. A circuit unit for a timepiece comprising a plurality of individual lead members, a lead frame having an integrated circuit die-bonded thereto, said lead frame being formed generally into a letter "H", said lead frame comprising a pair of parallel side members and a connecting portion between said side members, multiple other lead members comprising part of said lead frame and separated from said die-bonding lead member, said other lead members having individual one end portions positioned in the vicinity of said integrated circuit and electrically connected thereto by bonding wires and integrated with a potting resin and an insulating plate backing said potting resin, and having individual other end portions exposed from the potting resin and free of support by the insulating plate to define electrical contacts for external circuit elements.

8. The circuit unit according to claim 7, wherein the generally "H" shaped member further comprises jointing members for connecting respective end portions of the side members, the other lead members being arranged so they are partly surrounded by said side members, said connecting portion and said jointing members.

9. The circuit unit according to claim 8, wherein one of said jointing members is connected with one of the contacts of a battery.

10. The circuit unit according to claim 7, wherein the holding member is formed integrally with a coil bobbin on which a driver coil of a driving motor is wound.

* * * * *